(12) United States Patent
Scott et al.

(10) Patent No.: US 9,948,251 B2
(45) Date of Patent: Apr. 17, 2018

(54) LOW NOISE AMPLIFIER (LNA) SYSTEM

(71) Applicant: Qorvo US, Inc., Greensboro, NC (US)

(72) Inventors: Baker Scott, San Jose, CA (US);
George Maxim, Saratoga, CA (US);
Dirk Robert Walter Leipold, San Jose, CA (US); Kelvin Kai Tuan Yan, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/454,828

(22) Filed: Mar. 9, 2017

(65) Prior Publication Data

US 2017/0264249 A1    Sep. 14, 2017

Related U.S. Application Data

(60) Provisional application No. 62/306,133, filed on Mar. 10, 2016.

(51) Int. Cl.
| | |
|---|---|
| *H03F 3/04* | (2006.01) |
| *H03F 3/19* | (2006.01) |
| *H03F 1/02* | (2006.01) |

(52) U.S. Cl.
CPC ............. *H03F 3/19* (2013.01); *H03F 1/0272* (2013.01); *H03F 1/0277* (2013.01); *H03F 2200/102* (2013.01); *H03F 2200/294* (2013.01); *H03F 2200/451* (2013.01)

(58) Field of Classification Search
CPC ................ H03F 3/04; H03F 3/20; H03G 3/30
USPC .................................................. 330/296, 285
See application file for complete search history.

(56) References Cited

U.S. PATENT DOCUMENTS

| | | | | |
|---|---|---|---|---|
| 6,118,991 | A * | 9/2000 | Jean ...................... | H03F 3/1935 330/100 |
| 8,704,598 | B2 * | 4/2014 | Kobayashi ................ | H03F 1/34 330/294 |
| 2013/0137383 | A1 * | 5/2013 | Kobayashi ................ | H03F 1/34 455/77 |

* cited by examiner

*Primary Examiner* — Henry Choe
(74) *Attorney, Agent, or Firm* — Withrow & Terranova, P.L.L.C.

(57) ABSTRACT

A low noise amplifier (LNA) system having a constant noise factor (Const-NF) mode and a constant third-order intercept (Const-IP3) mode is disclosed. The LNA system includes an LNA core and a trade-off bias network coupled to the LNA core to selectably bias the LNA core to realize the Const-NF mode and the Const-IP3 mode. The trade-off bias network is made up of selectable Const-NF circuitry and selectable Const-IP3 circuitry. The LNA system further includes a bias switching controller that is configured to enable the selectable Const-NF circuitry and disable the selectable Const-IP3 circuitry to select the Const-NF mode in response to a first condition and to disable the selectable Const-NF circuitry and enable the selectable Const-IP3 circuitry to select the Const-IP3 mode in response to a second condition.

20 Claims, 10 Drawing Sheets

FIG. 10B PRESENT EMBODIMENT

LOW NOISE AMPLIFIER (LNA) SYSTEM

RELATED APPLICATIONS

This application claims the benefit of provisional patent application Ser. No. 62/306,133, filed Mar. 10, 2016, the disclosure of which is hereby incorporated herein by reference in its entirety.

FIELD OF THE DISCLOSURE

The present disclosure relates to a low noise amplifier (LNA) system that changes bias in response to changing conditions.

BACKGROUND

Traditional low noise amplifier (LNA) biasing using a constant-current or pseudo-constant-current bias scheme will typically result in unsatisfactory performance variation over design corners such as process, temperature, and supply voltage. Thus, high performance LNAs traditionally require costly over-designed compensating circuitry in order to have required performance specifications guaranteed by design. What is needed is an LNA system that does not include costly over-designed compensating circuitry to meet required performance specifications.

SUMMARY

A low noise amplifier (LNA) system having a constant noise factor (Const-NF) mode and a constant third-order intercept (Const-IP3) mode is disclosed. The LNA system includes an LNA core and a trade-off bias network coupled to the LNA core to selectably bias the LNA core to realize the Const-NF mode and the Const-IP3 mode. The trade-off bias network is made up of selectable Const-NF circuitry and selectable Const-IP3 circuitry. The LNA system further includes a bias switching controller that is configured to enable the selectable Const-NF circuitry and disable the selectable Const-IP3 circuitry to select the Const-NF mode in response to a first condition and to disable the selectable Const-NF circuitry and enable the selectable Const-IP3 circuitry to select the Const-IP3 mode in response to a second condition.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For the purpose of this disclosure a natural number is defined as a counting number that does not include infinity.

In wireless communication systems such as cellular telephone systems, some frequency bands at least partially overlap. The overlap of the frequency bands provides an opportunity for designers to reduce a number of low noise amplifiers (LNAs) that would otherwise be necessary by sharing a given LNA among several frequency bands. However, different frequency bands may use different types of filters with different in-band insertion loss and different out-of-band rejection. In addition, the different frequency bands may have differing blocker signal level scenarios. As such, a shared LNA will likely need to meet different specifications when operating in different frequency bands. The present disclosure provides an LNA system that switches between a constant noise factor (Const-NF) biased operation and a constant third-order intercept (Const-IP3) biased operation of an LNA core within the LNA system.

For the purpose of this disclosure, noise factor (F) is defined as a quantitative measure of LNA performance with respect to noise for a given bandwidth. An equation (EQ 1) for noise factor is:

$$F=(S_{IN}/N_{IN})/(S_{OUT}/N_{OUT}) \quad \text{EQ 1}$$

Where $S_{IN}$ is the signal level at the input of the amplifier, $N_{IN}$ is the noise level at the input of the amplifier, $S_{OUT}$ is the signal level at the output of the amplifier, $N_{OUT}$ is the noise level at the output of the amplifier, and noise figure (NF) is noise factor (F) expressed in decibels.

For the purpose of this disclosure, a third-order intercept point (IP3) is a point at which power in a third-order product and a fundamental tone intersect, when an amplifier such as an LNA is biased for linear operation. A third-order intercept point at the amplifier input is known as IIP3, and a third-order intercept point at the amplifier output is known as OIP3. Note that in general, IP3 is a figure of merit used to describe linearity of a device such as an LNA.

Figure 1:
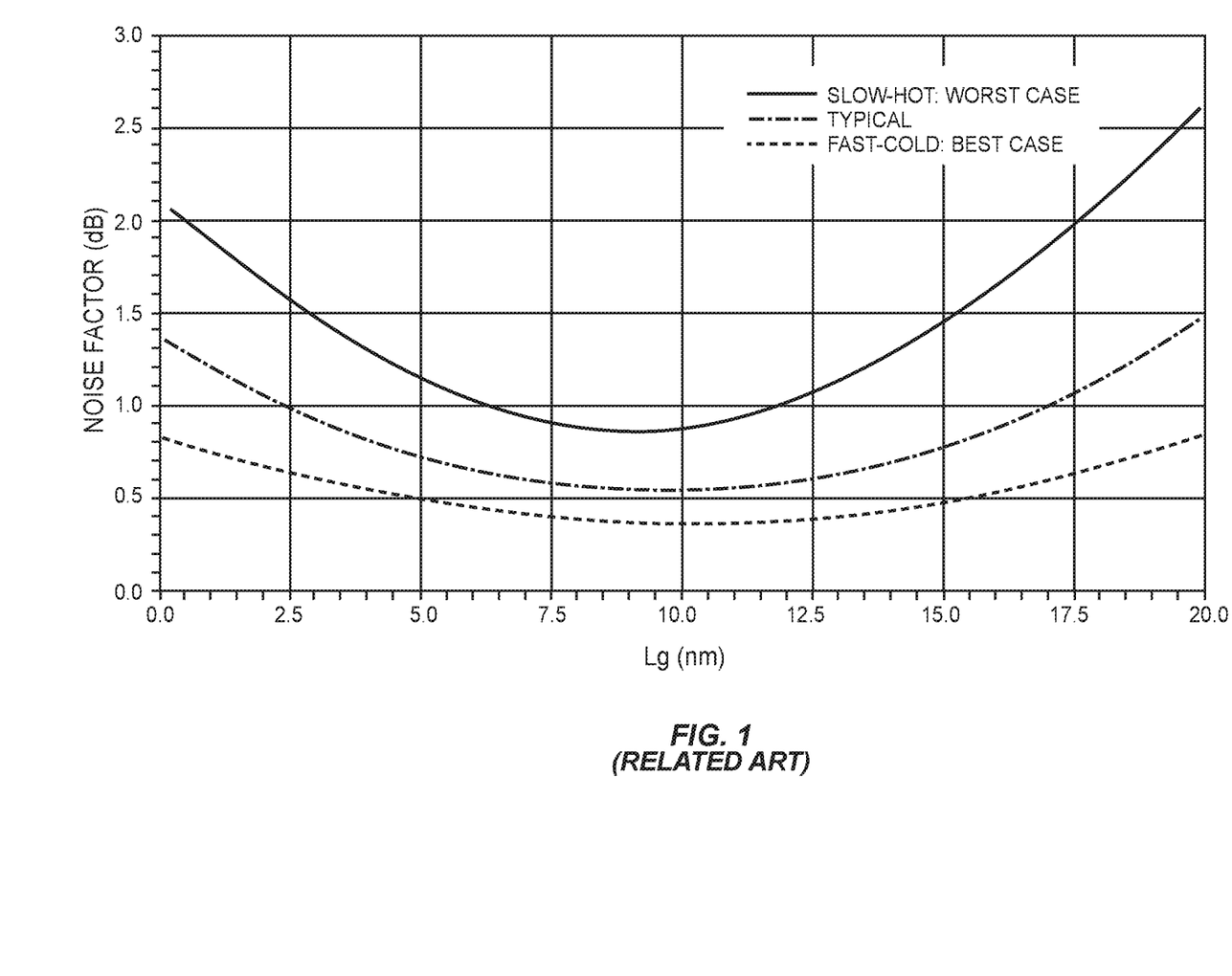
FIG. 1 is a graph depicting noise factor variation of a related art constant-current biased LNA system illustrating a first problem solved by embodiments of the present disclosure.

FIG. 1 is a graph depicting noise factor variation of a related art constant-current biased LNA system illustrating a first problem solved by embodiments of the present disclosure. As shown in FIG. 1, a traditional constant-current bias circuit for an LNA system has a variation of at least 0.3 dB over process and temperature corners. Embodiments of the present disclosure provide overall improved system performance by replacing traditional constant-current bias circuitry with Const-NF bias circuitry.

Figure 2:
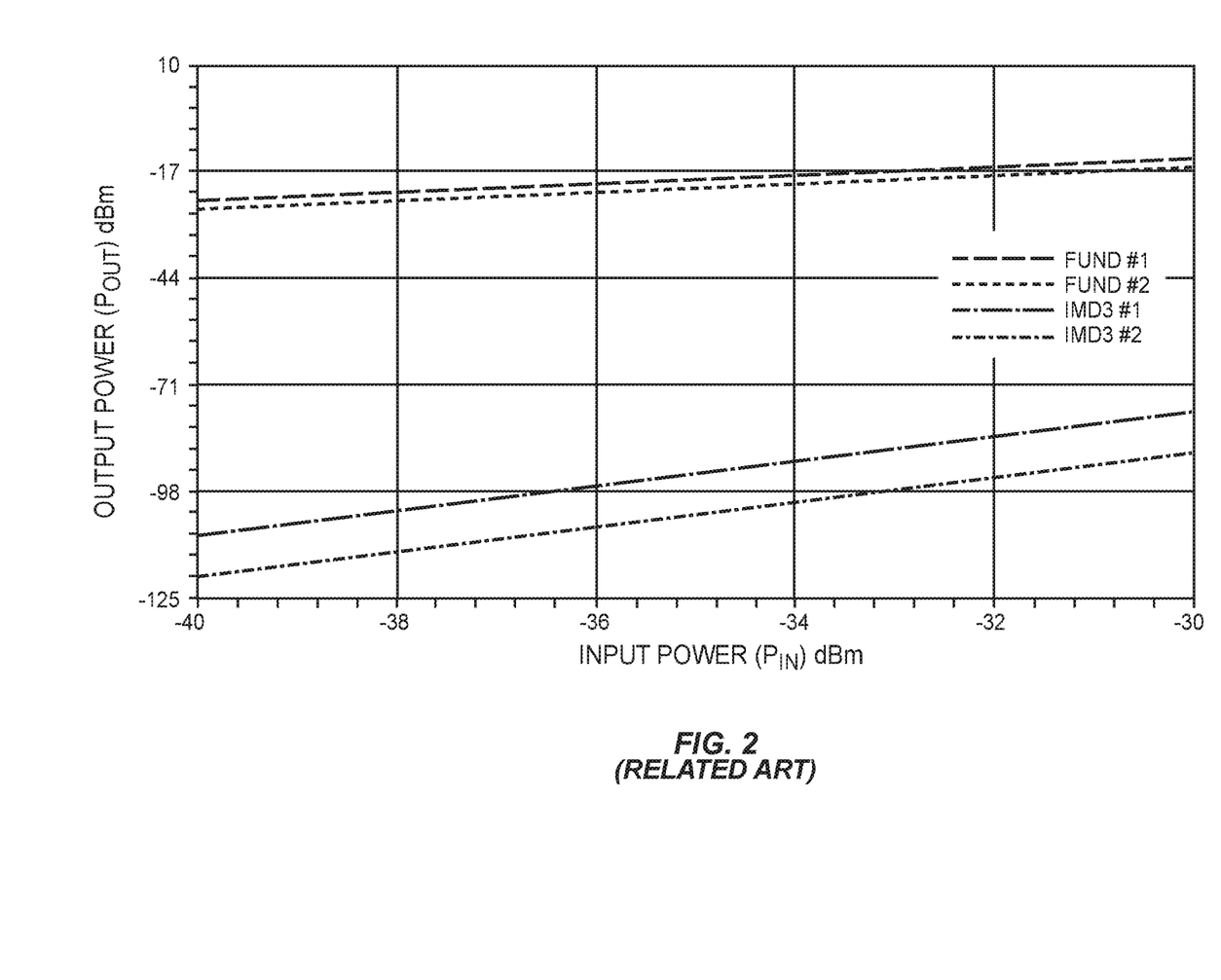
FIG. 2 is a graph depicting third-order intermodulation distortion (IMD3) products for input power versus output power of a fundamental signal for a related art constant-current biased LNA system illustrating a second problem solved by embodiments of the present disclosure.

FIG. 2 is a graph depicting third-order intermodulation distortion (IMD3) products for input power versus output power of a fundamental signal for a related art constant-current biased LNA system illustrating a second problem solved by embodiments of the present disclosure. In particular, the IMD3 products plotted in FIG. 2 depict an input constant third-order intercept (IIP3) variation of 6 dB over process and temperature corners for an LNA system biased using related art constant-current bias circuitry. Embodiments of the present disclosure provide improved noise factor performance by replacing traditional constant-current bias circuitry with constant third-order intercept (Const-IP3) bias circuitry.

Figure 3:
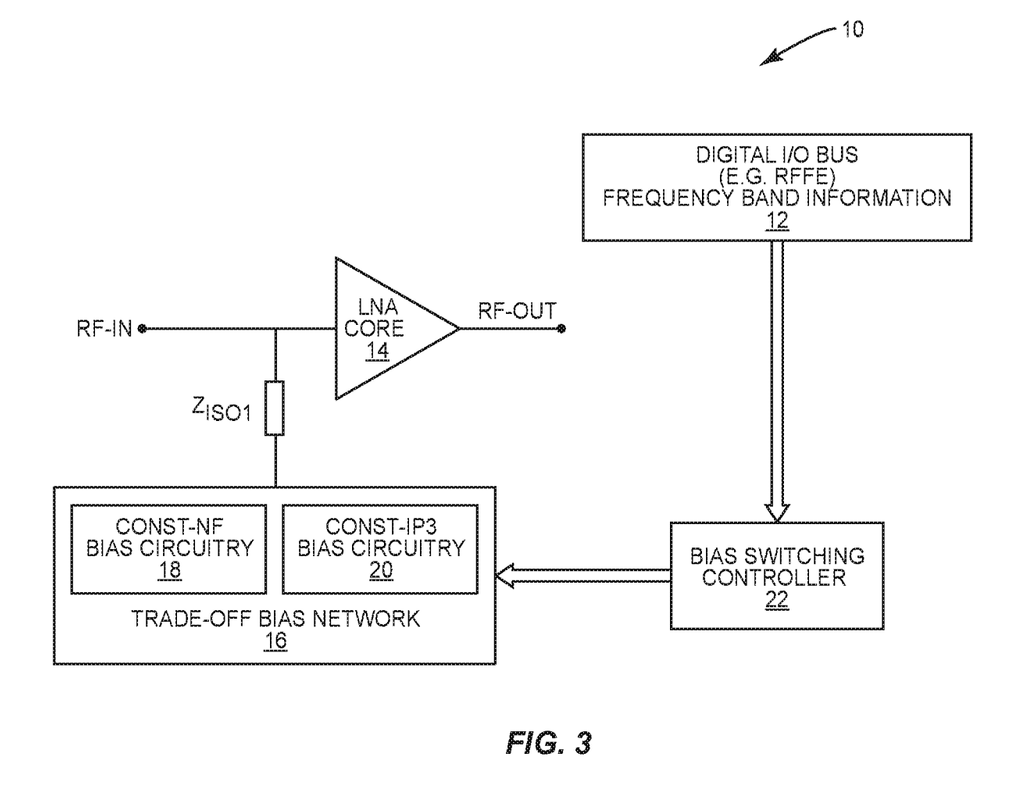
FIG. 3 is a diagram of an LNA system embodiment of the present disclosure that provides open-loop trade-off bias switching based upon frequency band information passed to the LNA system over a digital input/output (I/O) bus.

FIG. 3 is a circuit diagram of an LNA system 10 of the present disclosure that provides open-loop trade-off bias switching based upon frequency band information passed to the LNA system 10 over a digital input/output (I/O) bus 12, which can be a radio frequency front end control interface (RFFE) bus. The LNA system 10 includes an LNA core 14 having a radio frequency signal input (RF-IN), and an RF signal output (RF-OUT). As a result of operating criteria such as minimizing noise factor and non-linearity associated with operation the LNA core 14, it is typically necessary to move the established operating point as operating conditions change over exemplary design corners such as process, supply voltage, and temperature. It is to be understood that other design corners known in the art are considered within the scope of this disclosure.

A primary noise source of the LNA core 14 is thermal noise within channels of field effect transistors (FETs) making up the LNA core 14. A channel of a FET has a length L and a width W. Transconductance (gm) for a FET is directly proportional to W. Thus, effectively increasing W also increases gm, and increasing the gm of LNA core 14 decreases the noise factor and a corresponding noise figure (NF) for the LNA core 14. Embodiments of the LNA system 10 are configured to selectively maintain a change in NF to no more than 0.5 dB over design corners of process, supply voltage, and temperature.

In addition to minimized NF, linear operation of the LNA core 14 is also highly desirable. IP3 as discussed above is a figure of merit used to make linearity comparisons between amplifier devices such as the LNA core 14. In contrast to NF, IP3 is dependent upon drain-to-source saturation voltage ($V_{DSSAT}$) of the LNA core 14. A maximized IP3 for the LNA core 14 requires a $V_{DSSAT}$ biased operating point for the LNA core 14. A higher $V_{DSSAT}$ results in a lower gm value in comparison to a higher gm value provided for a minimized NF operation. As a result of contrasting demands for biasing the LNA core 14 for a desirable operating point, a trade-off between favoring better NF performance versus favoring better IP3 performance for the LNA core 14 is necessary under differing conditions. For example, when a blocker signal at RF-IN is large enough to drive the LNA core 14 near compression, operation of the LNA core 14 in a constant third-order intercept (Const-IP3) mode is selected in favor of increased linearity performance for the LNA core 14. In contrast, operation of the LNA core 14 in a constant NF (Const-NF) mode is selected to favor increased NF performance when the blocker signal level is low enough such that the LNA core 14 is operating substantially below compression.

In this regard, a trade-off bias network 16 is coupled to the LNA core 14 through an isolation impedance $Z_{ISO1}$ in order to maintain Const-NF operation of the LNA core 14 while the Const-NF mode is selected. The trade-off bias network 16 also maintains constant third-order intercept (Const-IP3) operation of the LNA core 14 while the Const-IP3 mode is selected. The isolation impedance $Z_{ISO1}$ is impedes RF signal flow from entering the trade-off bias network 16.

In order to achieve the Const-NF mode, the trade-off bias network 16 includes selectable Const-NF bias circuitry 18 that is configured to bias the LNA core 14 for the Const-NF mode. In order to achieve the Const-IP3 mode, the trade-off bias network 16 further includes selectable Const-IP3 bias circuitry 20 that is configured to bias the LNA core 14 for the Const-IP3 mode. It is to be understood that while the exemplary embodiment of FIG. 3 implements the Const-IP3 mode by controlling input IP3 (IIP3), other embodiments can be realized that implement the Const-IP3 mode by controlling output IP3 (OIP3).

A bias switching controller 22 is coupled between the digital I/O bus 12 and the trade-off bias network 16 to provide appropriate switching between the Const-NF bias circuitry 18 and the Const-IP3 bias circuitry 20 depending upon which of either the Const-IP3 mode and the Const-NF mode requires implementation based upon current operating conditions experienced by the LNA system 10. The bias switching controller 22 determines the appropriate one of the Const-IP3 mode and the Const-NF mode based upon frequency band information provided over the digital I/O bus 12. In response to the frequency band information, the bias switching controller 22 will either enable the Const-NF bias circuitry 18 and disable the Const-IP3 bias circuitry 20, or disable the Const-NF bias circuitry 18 and enable the Const-IP3 bias circuitry 20. In other embodiments, the bias switching controller 22 will perform the same actions, but based instead upon receiving other information, such as process, supply voltage, temperature, and RF blocker level measured by external circuitry (not shown). For example, process variations can be determined by circuitry that measures gate oxide capacitance ($C_{OX}$) per unit area of FETs making up the LNA core 14.

Figure 4:
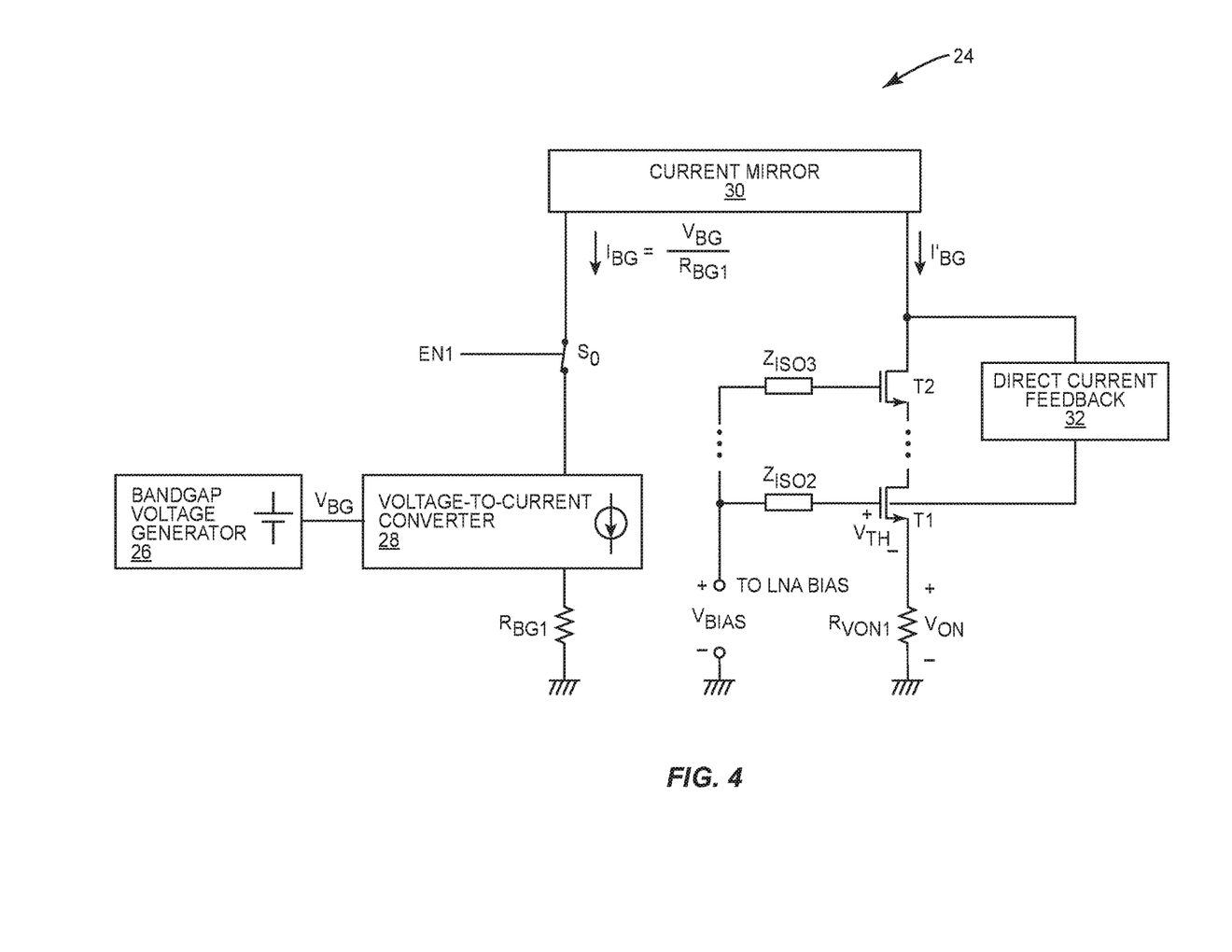
FIG. 4 is a circuit diagram depicting exemplary constant distortion bias circuitry that is configurable as the Const-NF circuitry and the Const-IP3 circuitry within the trade-off bias network.

FIG. 4 is a circuit diagram depicting an example of constant distortion bias circuitry 24 that is configurable as the Const-NF bias circuitry 18 and the Const-IP3 circuitry comprises the trade-off Bias network 16. The constant distortion bias circuitry 24 includes a band gap voltage generator 26 that generates a temperature independent band gap voltage $V_{BG}$. A voltage-to-current converter 28 draws a band gap current $I_{BG}$ from a current mirror 30. The band gap current $I_{BG}$ is equal to the band gap voltage $V_{BG}$ divided by a scaling resistor $R_{BG1}$.

The current mirror 30 provides a mirrored current $I'_{BG}$ that is proportional to the band gap current $I_{BG}$. The mirrored current $I'_{BG}$ feeds a stack of transistors made up of a lower device T1 and an upper device T2. It is to be understood that more devices can be stacked between the upper device T2 and the lower device T1. In the exemplary embodiment of FIG. 4, a drain of the upper device T2 is coupled to a direct current feedback loop 32 that couples to the body of the lower device T1. An ON-state voltage $V_{ON}$ is developed across a bias-on resistor $R_{VON1}$ that is coupled between a source of the lower device T1 and a fixed voltage node such as ground. The ON-state voltage $V_{ON}$ is equal to a scaling factor α multiplied by the band gap voltage $V_{BG}$. The scaling factor α is set by the size of the lower device T1. A bias voltage $V_{BIAS}$ provided to the LNA core 14 of FIG. 3 is equal to a threshold voltage $V_{TH}$ of the lower device T1 plus the ON-state voltage $V_{ON}$. Component values for the scaling resistor $R_{BG1}$, the bias-on resistor $R_{VON1}$, and the size of the lower device T1 determine the level of bias voltage $V_{BIAS}$. Thus, component value selection determines whether or not the constant distortion bias circuitry 24 is configured either as the Const-NF bias circuitry 18 or the Const-IP3 bias circuitry 20. As such, one set of component values for the constant distortion bias circuitry 24 yields the Const-NF bias circuitry 18 and another set of component values for the constant distortion bias circuitry 24 yields the Const-IP3 bias circuitry 20. An enable/disable switch $S_0$ is controlled by the bias switching controller 22 by way of an enable signal EN1 to enable or disable providing the bias voltage $V_{BIAS}$. When the enable/disable switch $S_0$ is closed, $V_{BIAS}$ is provided. In contrast, when the enable/disable switch $S_0$ is open, $V_{BIAS}$ is not provided. In this way, the Const-NF bias circuitry 18 and the Const-IP3 bias circuitry 20 will not provide conflicting $V_{BIAS}$ voltages. Isolation impedances $Z_{ISO2}$ and $Z_{ISO3}$ provide isolation between the Const-NF bias circuitry 18 and the Const-IP3 bias circuitry 20.

Figure 5:
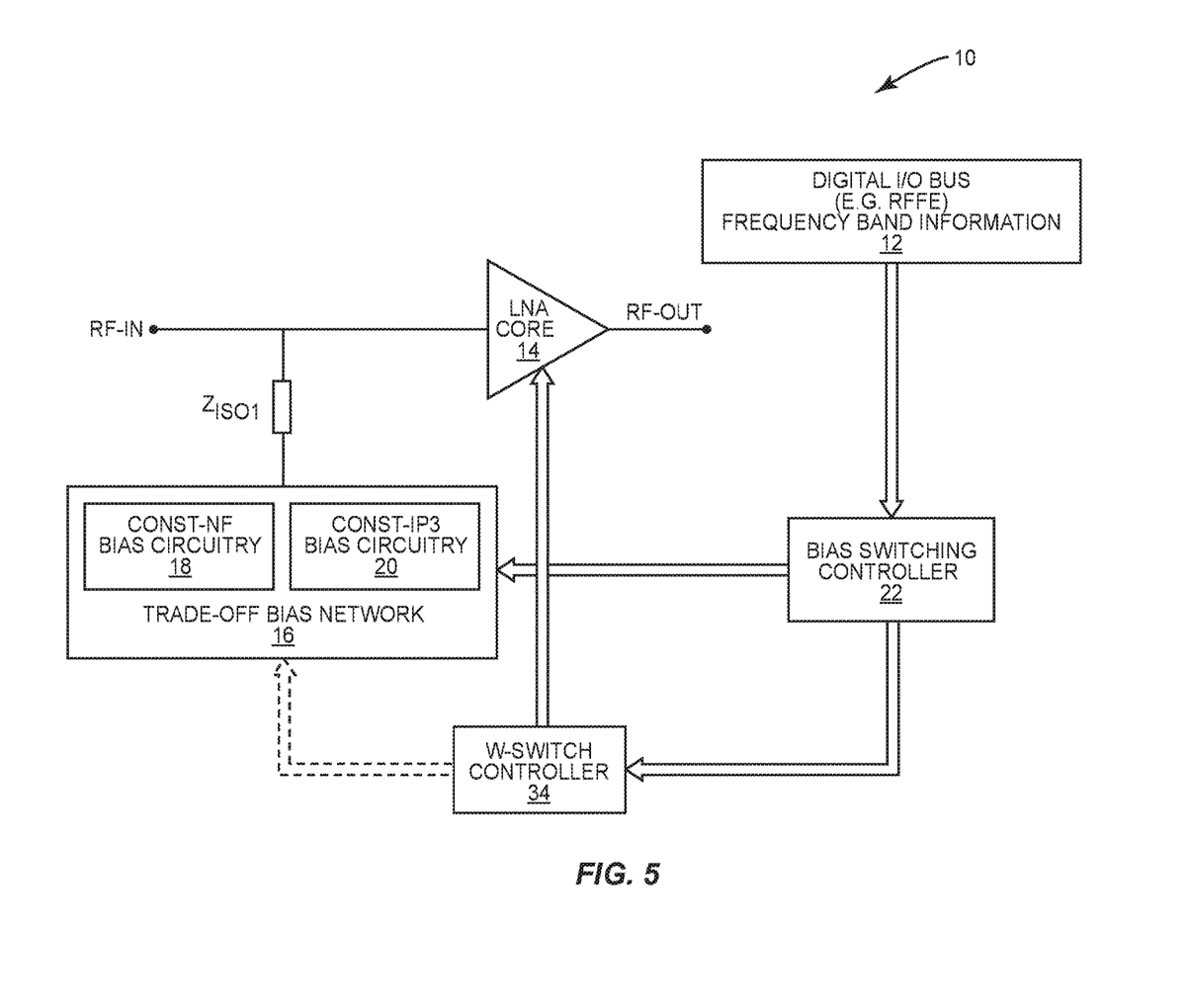
FIG. 5 is a circuit diagram of an LNA system embodiment of the present disclosure that adds effective device width-switching (W-switching) to the embodiment of FIG. 3.

FIG. 5 is a circuit diagram of the LNA system 10 that adds effective device width-switching (W-switching) to the embodiment of FIG. 3 in order to provide an additional means of Const-IP3 bias for the LNA core 14. A W-switch controller 34 is coupled between the bias switching controller 22 and the LNA core 14. In at least one embodiment, the W-switch controller 34 can also optionally control switching between the Const-NF bias circuitry 18 and the Const-IP3 bias circuitry 20 of the trade-off bias network 16 to enhance linearization of LNA system 10. Optional control of the trade-off bias network 16 by the W-switch controller 34 is depicted in dashed line.

Figure 6:
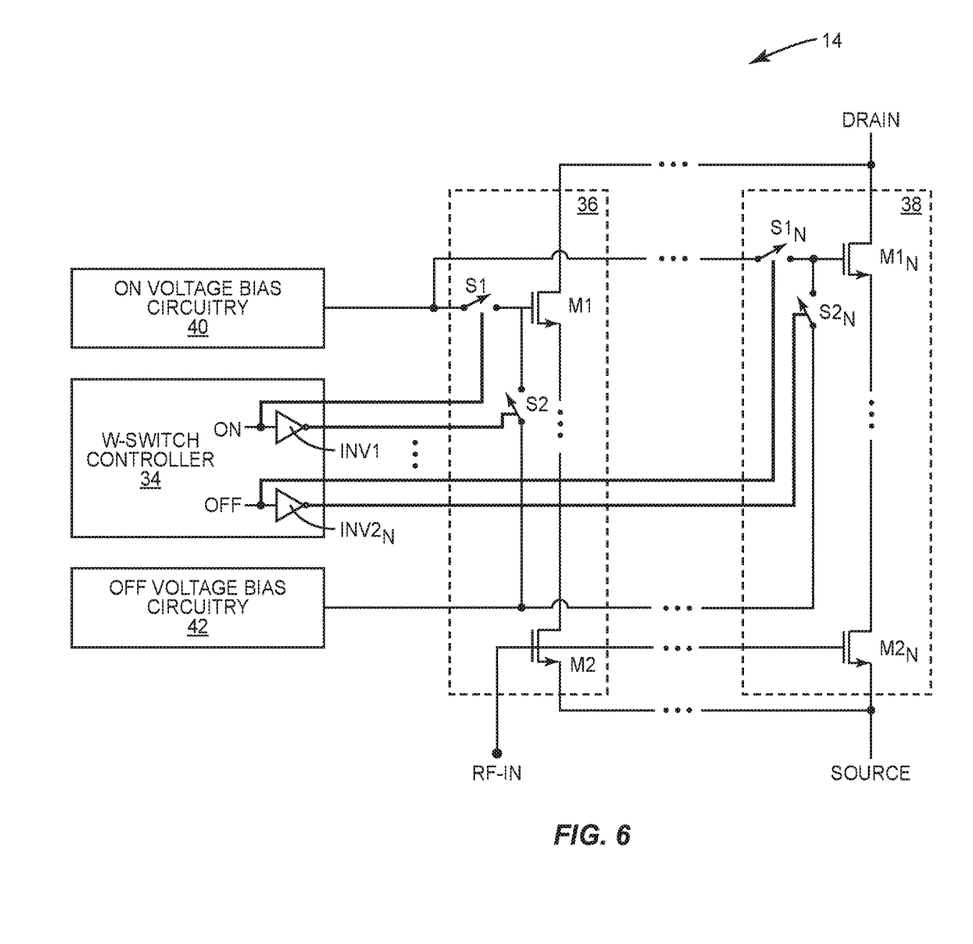
FIG. 6 is a circuit diagram depicting an exemplary LNA core that illustrates device width-switching (W-switching).

FIG. 6 is a circuit diagram depicting an exemplary version of the LNA core 14 that is configured for W-switching. In this embodiment, the LNA core 14 includes an N number of switchable amplifier segments that includes a first amplifier segment 36 and an Nth amplifier segment 38, where N is a natural number. Other amplifier segments are coupled in parallel with the first amplifier segment 36 and the Nth amplifier segment 38. The effective device width W for the LNA core 14 is determined by how many of the N number of switchable amplifier segments are switched on by the W-switch controller 34 at a given time.

The first amplifier segment 36 includes a first upper transistor M1 and a first lower transistor M2. Other transistors can be coupled in series, drain to source, between the first upper transistor M1 and the first lower transistor M2. The first lower transistor M2 has a gate coupled to a radio frequency signal input terminal (RFIN). The first upper transistor M1 has a gate coupled to ON voltage bias circuitry 40 through a first switch S1. The ON voltage bias circuitry 40 supplies an on-state bias voltage for the first amplifier segment 36 when the first switch S1 is closed as depicted in FIG. 6. The W-switch controller 34 controls opening and closing of the first switch.

An off voltage bias circuitry 42 is coupled to the gate of the first upper transistor M1 through a second switch S2. The OFF voltage bias circuitry 42 provides an OFF-state bias voltage for the first amplifier segment 36 when the second switch S2 is closed and the first switch S1 is open. FIG. 6 shows the second switch S2 in an open position. Thus, the first amplifier segment 36 is depicted as being switched off by the W-switch controller 34. An inverter INV1 or its function is included in the W-switch controller 34 to ensure that the first switch S1 and the second switch S2 cannot both be in the closed position or the open position simultaneously.

The Nth amplifier segment 38 includes an Nth first upper transistor $M1_N$ and an Nth lower transistor $M2_N$. Other transistors can be coupled in series drain to source between the Nth first upper transistor $M1_N$ and the Nth first lower transistor $M2_N$. The Nth first lower transistor $M2_N$ has a gate coupled to RFIN. The Nth first upper transistor $M1_N$ has a gate coupled to the ON voltage bias circuitry 40 through an Nth first switch $S1_N$. The ON voltage bias circuitry 40 supplies the ON-state bias voltage for the Nth amplifier segment 38 when the Nth first switch $S1_N$ is closed. The Nth first switch $S1_N$ is depicted in an open position in FIG. 6. Thus, the Nth amplifier segment 38 is depicted as being switched off by the W-switch controller 34.

The OFF voltage bias circuitry 42 is coupled to the gate of the Nth first upper transistor $M1_N$ through an Nth second switch $S2_N$. The OFF voltage bias circuitry 42 provides an OFF-state bias voltage for the Nth amplifier segment 38 when the Nth second switch $S2_N$ is closed and the Nth first switch $S1_N$ is open.

FIG. 6 shows the Nth second switch $S2_N$ in a closed position. Thus, the first amplifier segment 36 is depicted as being switched off by the W-switch controller 34. An inverter INV2 or its function is included in the W-switch controller 34 to ensure that the Nth first switch $S1_N$ and the Nth second switch $S2_N$ cannot both be in the closed position or the open position simultaneously.

Figure 7:
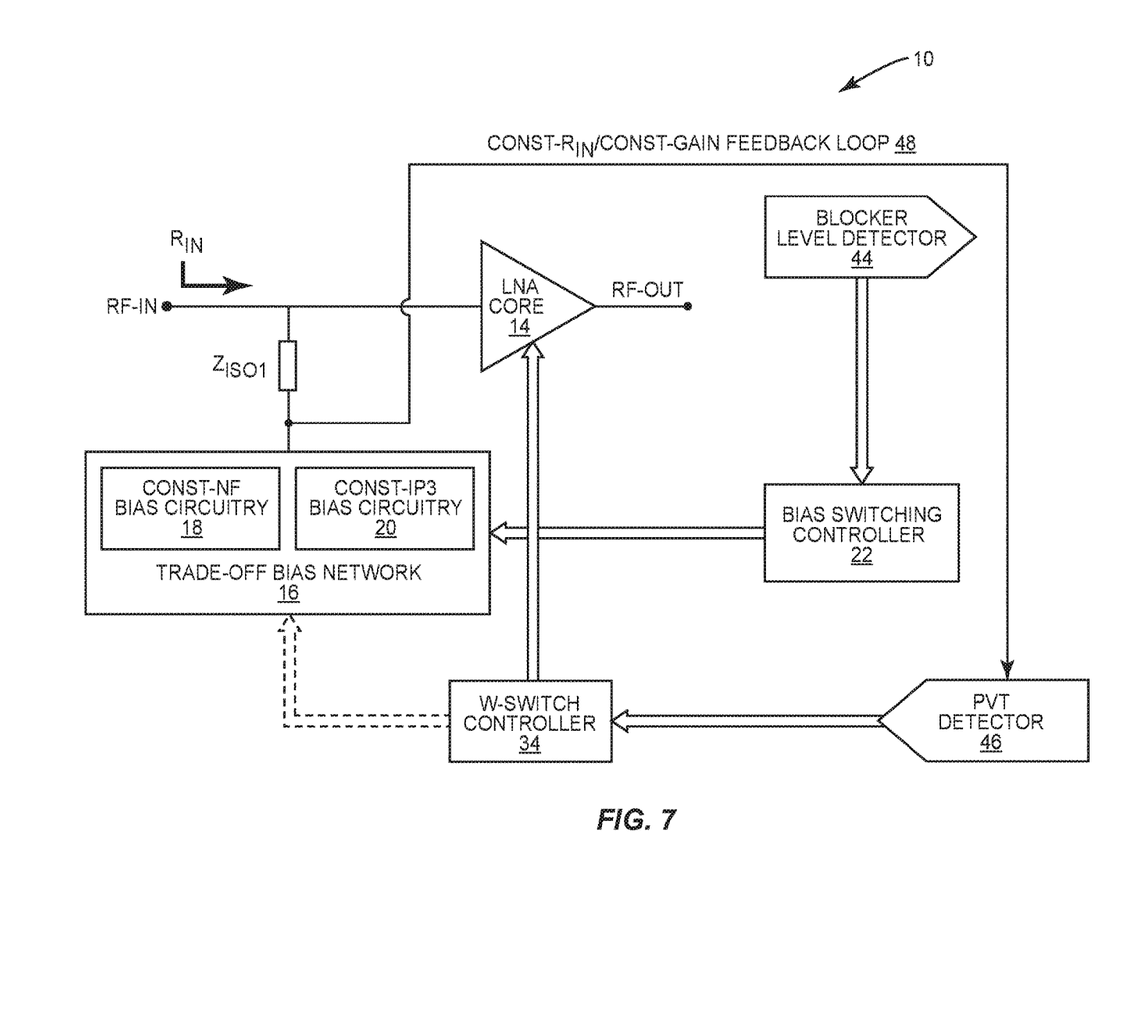
FIG. 7 is a circuit diagram depicting another exemplary embodiment of the LNA system that provides closed-loop trade-off bias switching and W-switching based upon radio frequency (RF) blocker level, process, supply voltage, and temperature detection.

FIG. 7 is a circuit diagram of a version of the LNA system 10 that provides closed-loop trade-off bias switching and W-switching based upon radio frequency (RF) blocker level, process, supply voltage, and temperature detection. In this exemplary embodiment a blocker level detector 44 communicates with the bias switching controller 22 such that during operation the bias switching controller 22 deselects the Const-NF bias circuitry 18 and selects the Const-IP3 bias circuitry 20 to provide a gm-lowering bias voltage to the LNA core 14 when the RF blocker level produces an IIP3 beyond a predetermined threshold such as +7.3 dBm. In contrast, when the RF blocker level is relatively low, the bias switching controller 22 deselects the Const-IP3 bias circuitry 20 and selects the Const-NF bias circuitry 18 to provide a gm-increasing bias voltage to the LNA core 14 such that NF is lowered when the RF blocker level is below the predetermined threshold.

A process, supply voltage, and temperature (PVT) detector 46 is included is this embodiment of LNA system 10 to provide the W-switch controller 34 with information pertaining to detected process, detected supply voltage, and detected temperature associated with the LNA system 10. The W-switch controller 34 is configured to dynamically adjust the effective device width W of the LNA core 14 in response to the PVT detector 46 by turning on or turning off individual ones of the amplifier segments that include the first amplifier segment 36 and the Nth amplifier segment 38 depicted in FIG. 6. Optionally, the W-switch controller 34 is configured to select and deselect the Const-NF bias circuitry 18 and the Const-IP3 bias circuitry 20 in response to output from the PVT detector 46. For example, the W-switch controller 34 will select the Const-NF bias circuitry 18 for one set of process, supply voltage, and temperature thresholds and select the Const-IP3 bias circuitry 20 for a different set of process, supply voltage, and temperature thresholds.

The LNA system 10 depicted in FIG. 6 also includes a constant-input resistance (Const-$R_{IN}$)/constant-gain (Const-Gain) feedback loop 48 that is coupled between the trade-off bias network 16 and the PVT Detector 46. The Const-RIN/Const-Gain feedback loop 48 provides closed loop feedback that is responsive to fluctuations in supply voltage and temperature.

Figure 8:
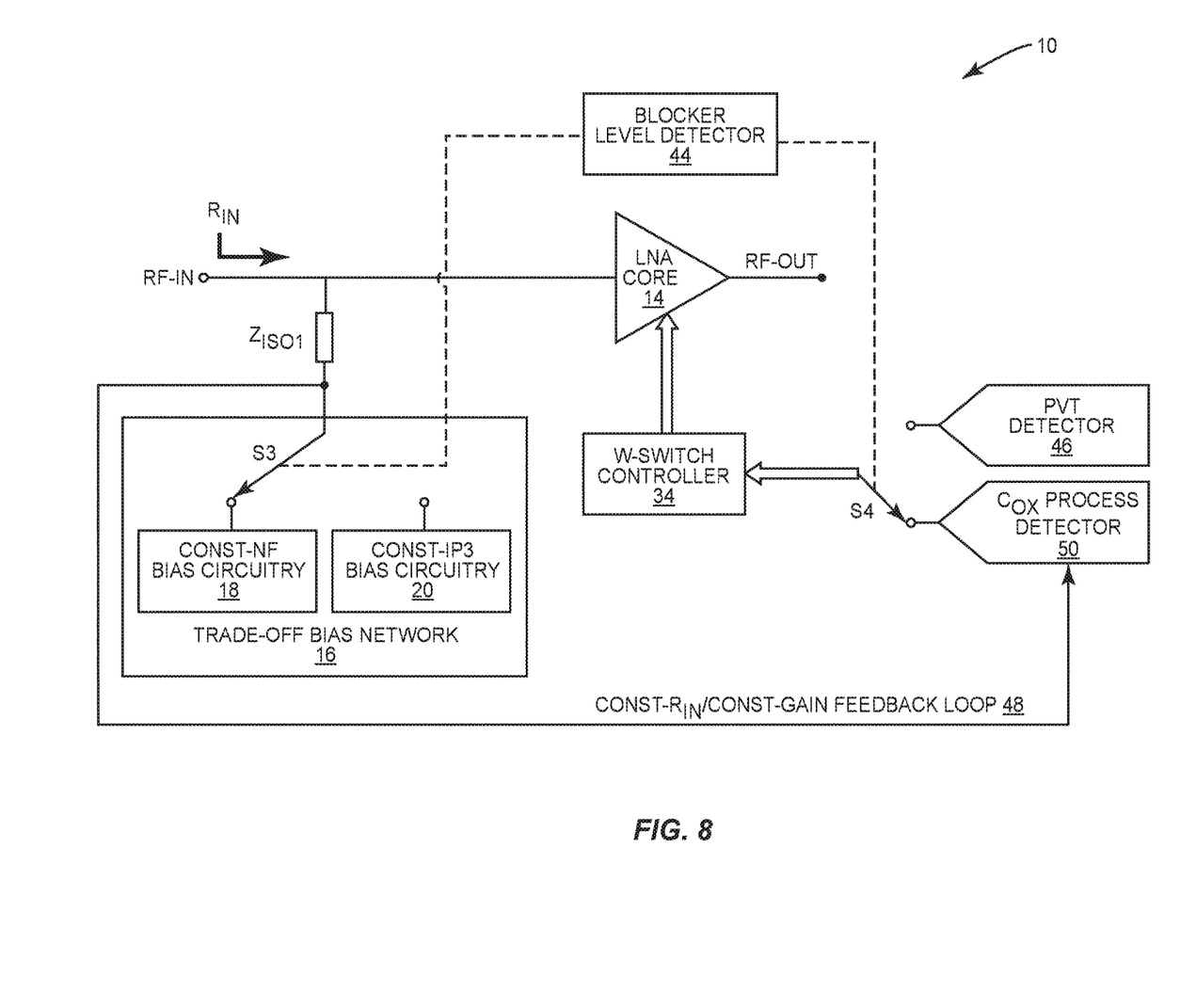
FIG. 8 is a circuit diagram depicting yet another exemplary embodiment of the LNA system that provides closed-loop trade-off bias switching and W-switching based upon RF blocker level, gate oxide capacitance ($C_{OX}$) process, supply voltage, and temperature detection.

FIG. 8 is a circuit diagram depicting yet another exemplary embodiment of the LNA system 10 that provides closed-loop trade-off bias switching and W-switching based upon RF blocker level, $C_{OX}$ process, supply voltage, and temperature detection. In this exemplary embodiment, the blocker level detector 44 is configured to automatically control switching between the Const-NF bias circuitry 18 and the Const-IP3 bias circuitry 20 based upon an RF signal blocker level detected by the blocker level detector 44. In this particular case, the blocker level detector 44 switches between a higher gm bias voltage output by the Const-NF bias circuitry 18 and a lower gm bias voltage output by the Const-IP3 bias circuitry 20 by way of a switch S3 that has a pole coupled to the LNA Core 14 through the first isolation impedance $Z_{ISO1}$.

The LNA system 10 in this particular embodiment includes a $C_{OX}$ process detector 50 that is dedicated to measuring the $C_{OX}$ of at least one of the transistors M1, M2, $M1_N$, $M2_N$. A capacitance-voltage test implemented by the $C_{OX}$ process detector 50 detects process related characteristics such as oxide thickness, mobile ion contamination, and interface trap density in wafer processes. While capacitance-voltage testing to detect the above listed process related characteristics is well known by those skilled in the art, combining such information with blocker level detection to automatically switch between Const-NF biasing and Const-IP3 biasing based upon process characteristics and blocker signal level is unique to this disclosure. A benefit of this presently disclosed ability is a reduction in overdesign costs typically required to meet stringent requirements of carrier aggregation type receiver (RX) LNA systems.

In this particular exemplary embodiment, the blocker level detector 44 is also further configured to switch between the PVT detector 46 and the $C_{OX}$ process detector 50 for input into the W-switch controller 34 using a fourth switch S4. Information provided to the W-switch controller 34 by the $C_{OX}$ process detector 50 is most relevant when the RF blocker level is low. As such, the blocker level detector 44 is configured to ensure that the third switch S3 and the fourth switch S4 are switched together such that an output of the $C_{OX}$ process detector 50 is coupled to the W-switch controller 34 by the fourth switch S4 whenever the third switch S3 couples an output of the Const-NF bias circuitry 18 to the LNA core 14 through the first isolation impedance $Z_{ISO1}$.

In contrast, information provided to the W-switch controller 34 by the PVT detector 46 is most relevant when the RF blocker level is high. As such, the blocker level detector 44 is configured to ensure that the third switch S3 and the fourth switch S4 are switched together such that an output of the PVT detector 46 is coupled to the W-switch controller 34 by the fourth switch S4 whenever the third switch S3 couples an output of the Const-IP3 bias circuitry 20 to the LNA core 14 through the first isolation impedance $Z_{ISO1}$.

Figure 9A:
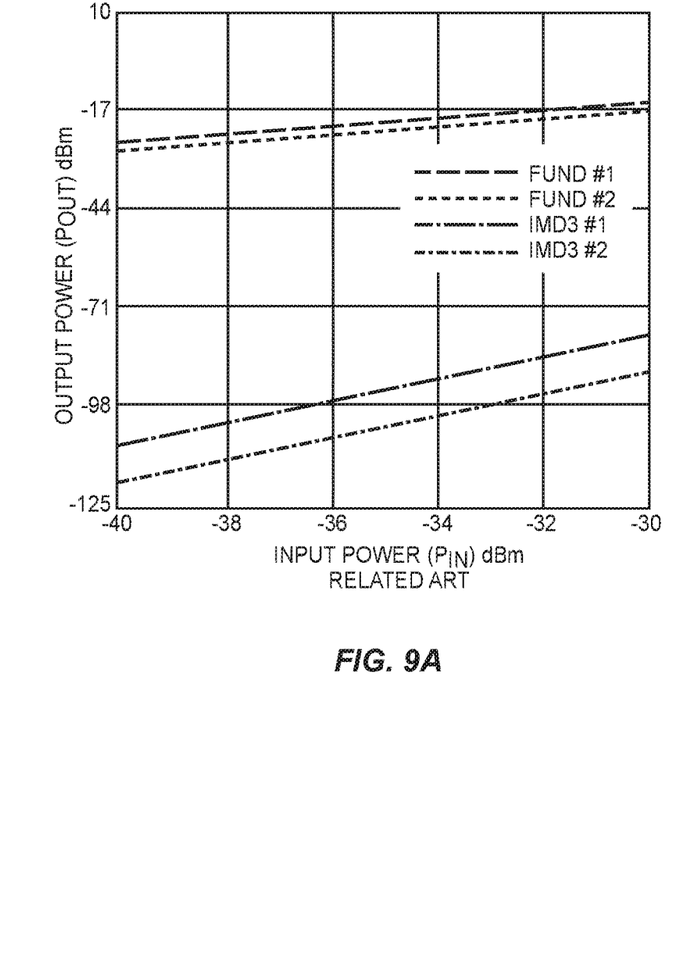
FIG. 9A is a graph depicting input third-order intercept point (IIP3) variation at the amplifier input of a related art constant-current biased LNA system.
Figure 9B:
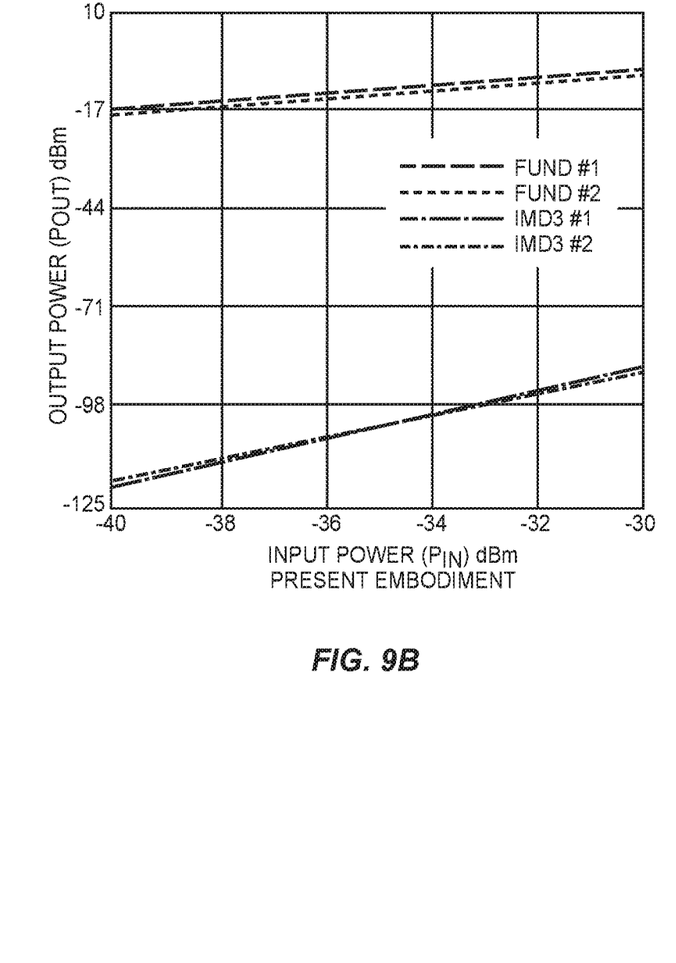
FIG. 9B is a graph depicting IIP3 variation at the amplifier input of the LNA system of FIG. 7.

FIG. 9A and FIG. 9B are graphs depicting a side by side comparison of IIP3 variation of a related art constant-current biased LNA system versus the LNA system 10 of FIG. 7. Note that Const-IP3 biasing provided by the LNA system 10 of FIG. 7 substantially clusters IMD3 curves relative to the IMD3 curves of the related art constant-current biased LNA system. Specifically, IIP3 variation derived from the graph labeled PRESENT EMBODIMENT in FIG. 9B yields a relatively small variation of (84.6/2)dBm-35 dBm=+7.3 dBm over process, supply voltage, and temperature. This relatively small variation meets modern specifications for carrier aggregation receivers.

Figure 10A:
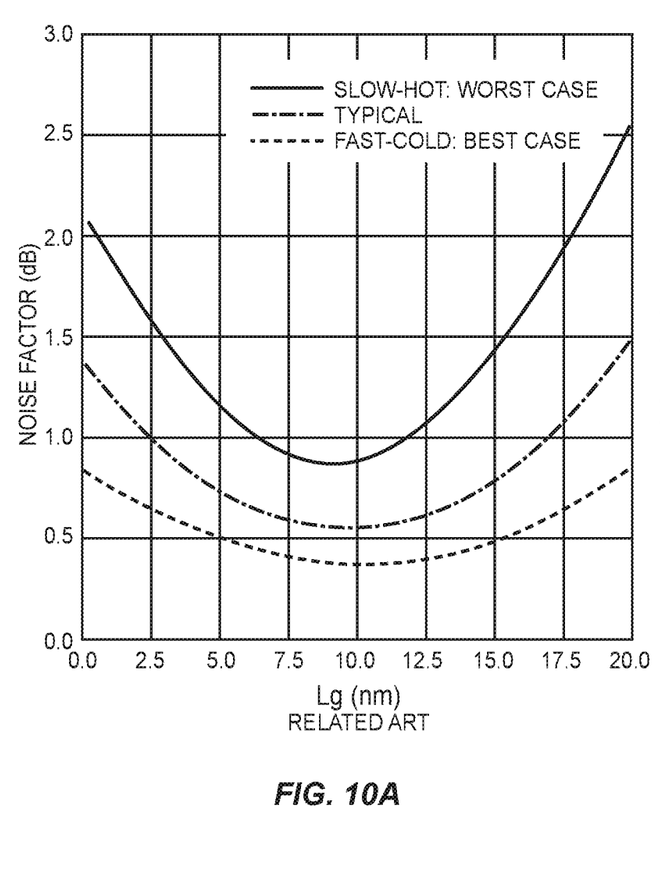
FIG. 10A is a graph depicting noise factor variation of a related art constant-current biased LNA system.
Figure 10B:
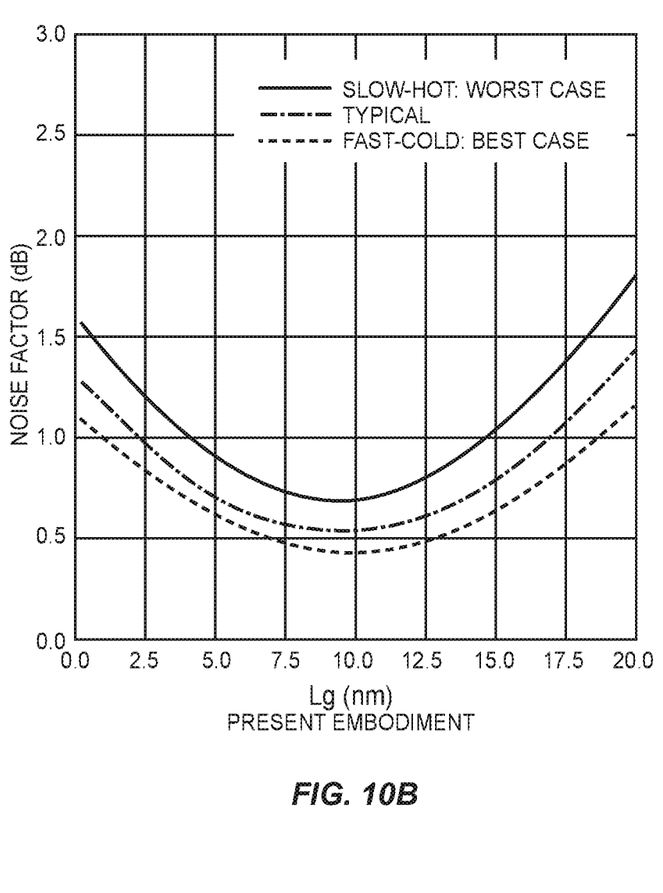
FIG. 10B is a graph depicting noise factor variation for the LNA system of FIG. 7.

FIG. 10A and FIG. 10B are graphs depicting a side by side comparison of noise factor variation of a related art constant-current biased LNA system versus the LNA system 10 of FIG. 7. Note in FIG. 10B that a maximum NF is reduced by 0.2 dB.

Those skilled in the art will recognize improvements and modifications to the preferred embodiments of the present disclosure. All such improvements and modifications are considered within the scope of the concepts disclosed herein and the claims that follow.

What is claimed is:

1. A low noise amplifier (LNA) system comprising:
   an LNA core;
   a trade-off bias network coupled to the LNA core to maintain constant noise factor (Const-NF) operation of the LNA core while in a Const-NF mode and to maintain constant third-order intercept (Const-IP3) operation of the LNA core while in a Const-IP3 mode, wherein the trade-off bias network comprises:
      selectable Const-NF circuitry configured to bias the LNA core for the Const-NF mode; and
      selectable Const-IP3 circuitry configured to bias the LNA core for the Const-IP3 mode; and
   a bias switching controller configured to enable the selectable Const-NF circuitry and disable the selectable Const-IP3 circuitry to select the Const-NF mode in response to a first condition and to disable the selectable Const-NF circuitry and enable the selectable Const-IP3 circuitry to select the Const-IP3 mode in response to a second condition.

2. The LNA system of claim 1 further comprising a digital input/output (I/O) bus coupled to the bias switching controller to convey frequency band identifying information to the bias switching controller.

3. The LNA system of claim 2 wherein the first condition is operation in a first frequency band expected to have a first RF blocker level below a predetermined threshold and the second condition is operation in a second frequency band expected to have a second RF blocker level above the predetermined threshold.

4. The LNA system of claim 1 further comprising a blocker level detector coupled to the bias switching controller to convey RF blocker level values to the bias switching controller.

5. The LNA system of claim 2 wherein the first condition is a detected first RF blocker level value below a predetermined threshold and the second condition is a detected second RF blocker level value above the predetermined threshold.

6. The LNA system of claim 1 further comprising a process, supply voltage, and temperature (PVT) detector coupled to the bias switching controller to convey detected process values, supply voltage values, and temperature values.

7. The LNA system of claim 6 wherein the first condition is one of a detected process value, a detected supply voltage value, and a detected temperature value below a predetermined threshold and the second condition is one of a detected process value, a detected supply voltage value, and a detected temperature value above the predetermined threshold.

8. The LNA system of claim 6 further including a constant-input resistance (Const-$R_{IN}$) feedback loop coupled between the trade-off bias network and the PVT detector.

9. The LNA system of claim 6 further including a constant gain (Const-Gain) feedback loop coupled between the trade-off bias network and the PVT detector.

10. The LNA system of claim 1 wherein the LNA core comprises an N number of switchable amplifier segments, where N is a natural number.

11. The LNA system of claim 10 further including a width-switching (W-switching) controller having at least a one control line coupled to each of the N number of switchable amplifier segments to enable and disable individual ones of the N number of switchable amplifier segments to adjust an effective device width of the LNA core in response to the first condition and the second condition.

12. The LNA system of claim 11 further comprising a blocker level detector coupled to the W-switching controller to convey RF blocker level values to the W-switching controller.

13. The LNA system of claim 12 wherein the first condition is a detected first RF blocker level value below a predetermined threshold and the second condition is a detected second RF blocker level value above the predetermined threshold.

14. The LNA system of claim 12 further comprising a gate oxide capacitance ($C_{OX}$) detector selectively coupled to the W-switching controller to convey detected $C_{OX}$ values to the W-switching controller.

15. The LNA system of claim 14 wherein the first condition is a detected $C_{OX}$ value below a predetermined threshold and the second condition is a detected $C_{OX}$ value above the predetermined threshold.

16. The LNA system of claim 14 wherein the blocker level detector is configured to selectively couple the $C_{OX}$ detector to the W-switching controller when a detected first RF blocker level value is below a predetermined threshold and to selectively uncouple the $C_{OX}$ detector from the W-switching controller when a detected second RF blocker level value is above the predetermined threshold.

17. The LNA system of claim 11 wherein the W-switching controller is further configured to enable the selectable Const-NF circuitry and disable the selectable Const-IP3 circuitry to select the Const-NF mode in response to the first condition and to disable the selectable Const-NF circuitry and enable the selectable Const-IP3 circuitry to select the Const-IP3 mode in response to the second condition.

18. The LNA system of claim 12 wherein the blocker level detector is coupled to the trade-off bias network and further configured to enable the selectable Const-NF circuitry and disable the selectable Const-IP3 circuitry to select the Const-NF mode in response to a detected first RF blocker level value below a predetermined threshold and to disable the selectable Const-NF circuitry and enable the selectable Const-IP3 circuitry to select the Const-IP3 mode in response to a detected first RF blocker level value above the predetermined threshold.

19. The LNA system of claim 12 wherein the Const-IP3 bias circuitry provides a transconductance (gm) lowering bias voltage to the LNA core when RF blocker level produces an input third-order intercept point (IIP3) above a predetermined threshold.

20. The LNA system of claim 12 wherein the Const-NF bias circuitry provides a gm raising bias voltage to the LNA core when RF blocker level produces an input third-order intercept point (IIP3) lower than a predetermined threshold.

* * * * *